United States Patent [19]
Morey

[11] Patent Number: 5,613,231
[45] Date of Patent: Mar. 18, 1997

[54] SUPER-REACTIVE OSCILLATOR AND RECEIVER

[76] Inventor: Gilles Morey, Saint-Ismier, France

[21] Appl. No.: 455,911

[22] Filed: May 31, 1995

[30] Foreign Application Priority Data

Jun. 3, 1994 [FR] France ................... 94 06795

[51] Int. Cl.$^6$ ................... H04B 1/24
[52] U.S. Cl. ................... 455/266; 455/318; 331/107 DP; 333/219.1
[58] Field of Search ................... 455/266, 313, 455/318, 319, 338; 331/107 DP, 107 SL, 107 C, 96; 333/219.1

[56] References Cited

U.S. PATENT DOCUMENTS

| | | | |
|---|---|---|---|
| 3,484,697 | 12/1969 | Abend | 325/373 |
| 3,599,197 | 8/1971 | Boyko | 340/258 |
| 4,079,341 | 3/1978 | Linn et al. | 331/96 |
| 4,370,626 | 1/1983 | Ushida | 331/96 |
| 4,375,621 | 3/1983 | Schneiter et al. | 332/16 T |
| 4,581,768 | 4/1986 | Aoki et al. | 455/179 |
| 4,694,262 | 9/1987 | Inoue et al. | 331/96 |
| 5,479,140 | 12/1995 | Abe et al. | 333/202 |

FOREIGN PATENT DOCUMENTS

| | | |
|---|---|---|
| 0271190 | 6/1988 | European Pat. Off. . |
| 0544180 | 6/1991 | European Pat. Off. . |

OTHER PUBLICATIONS

English language Abstract, vol. 15, No. 367, of Japanese Patent Laid Open Patent Publication No. JP-3,145,808, by Sugita Masatoshi, published Jun. 21, 1991.

"UHF Transmission-Line Oscillator-Design Using The Smith Chart," *Motorola Semiconductor Products, Inc. Application Note* AN-216, by Donald Wolleson, dated Sep. 4, 1967.

*Primary Examiner*—Reinhard J. Eisenzopf
*Assistant Examiner*—Lee Nguyen
*Attorney, Agent, or Firm*—Beveridge, DeGrandi, Weilacher & Young, L.L.P.

[57] ABSTRACT

An oscillator includes an active component or amplifier and a stabilizing reactive component. The active component is a bipolar transistor in a common base circuit and the reactive component is a dielectric resonator totally coupled to the collector of the transistor. A super-reactive receiver includes a bipolar transistor the base of which is connected to one pole of a power supply via a first resistor and to a common point via a second resistor and the emitter of which is connected to the same pole via a third resistor. The core of a ceramic tubular coaxial dielectric resonator is connected between the collector of the transistor and the common point. Its screen is connected to the common point. A capacitor is connected between the base of the transistor and the common point which is connected to the other pole of the power supply.

5 Claims, 1 Drawing Sheet

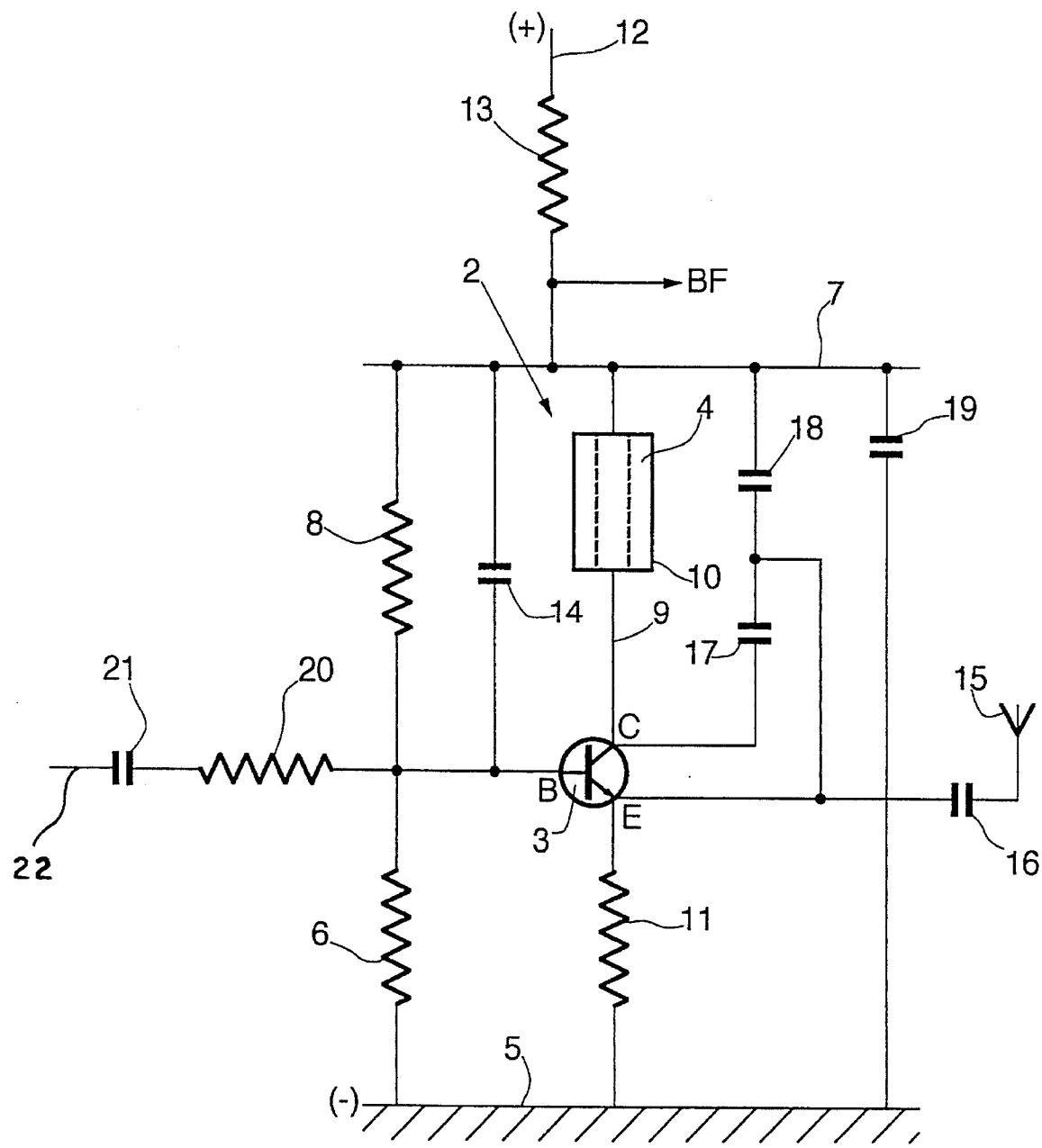

SUPER-REACTIVE OSCILLATOR AND RECEIVER

BACKGROUND OF THE INVENTION

1. Field of the Invention

The present invention concerns electricity and electronics and relates more particularly to the field of oscillators and radio receivers, especially super-reactive receivers.

2. Description of the Prior Art

The oscillators used in super-reactive receivers conventionally include reactive components such as inductors and capacitors.

The theory of super-reactive receivers has been known for a very long time. Its benefits are mainly greater simplicity, and therefore low cost, combined with relatively high sensitivity. Its drawbacks are mainly mediocre selectivity and relatively high levels of electromagnetic radiation at the receive frequency.

One object of the present invention is to propose an oscillator with maximal temperature stability and minimal electrical power consumption, the advantages of which are self-evident.

Another object of the present invention is to propose a very low power consumption super-reactive receiver with improved selectivity and stability and with little electromagnetic radiation at the receive frequency.

SUMMARY OF THE INVENTION

The invention consists in an oscillator including an active component or amplifier and a stabilizing reactive component, wherein said active component is a bipolar transistor in a common base circuit and said reactive component is a dielectric resonator totally coupled to the collector of said transistor.

Said resonator is preferably a ceramic dielectric quarter-wave coaxial resonator.

Said oscillator preferably includes a feedback circuit including a capacitor or a capacitive circuit coupled to the emitter of said transistor and electrically connected in parallel with said resonator.

The super-reactive receiver of the invention includes a bipolar transistor the base of which is connected to one pole of the power supply via a first resistor and to a common point via a second resistor and the emitter of which is connected to this pole via a third resistor, a ceramic tubular coaxial dielectric resonator the core of which is connected between the collector of said transistor and said common point and the screen of which is connected to said common point, and a capacitor connected between the base of said transistor and said common point, said common point being connected to the other pole of the power supply.

An antenna for receiving electromagnetic waves is preferably connected to the emitter of said transistor.

A disabling/enabling signal is preferably fed to the base of said transistor.

The emitter of said transistor is preferably connected to its collector via a first capacitor and to said common point via a second capacitor.

The following remarks are based on observation and analysis of the invention.

The criteria of temperature stability and low power consumption of an oscillator are particularly crucial in the implementation of a super-reactive superheterodyne receiver which is itself temperature stable and has low power consumption, including an oscillator that is successively disabled and then enabled, and in which the time required to achieve a given level of oscillation is dependent on external electromagnetic energy received at its inherent oscillation frequency at the time of the disabled/oscillation transition.

A super-reactive superheterodyne receiver is essentially a sampling type device and the theory of its operation requires that the sampling frequency be high in comparison to the highest harmonic frequency in the signal received.

There is therefore a lower limit on the sampling frequency and this imposes a maximum Q that can be used in practice, given that the time to obtain oscillation of the oscillator is dependent on the Q of the reactive component.

Against this background, the reactive component used in the invention represents an excellent compromise between an appropriate Q, high temperature stability and, in the context of a super-reactive superheterodyne receiver, an appropriate maximal usable bandwidth.

The reactive component used in the invention, and direct coupling of this component to the active component, yield an oscillator and therefore a super-reactive receiver of very low power consumption. The losses due to the reactive component are inversely proportional to it Q.

Another critical parameter relates to the fact that temperature stability is essentially dependent on variations in stray capacitances of the active component.

The invention couples the reactive component to the collector of a bipolar transistor which eliminates most of the variations in the base-emitter stray capacitance, which is the most critical stray capacitance. The collector-base and collector-emitter stray capacitances have less influence.

The invention uses a bipolar transistor which has the advantage of high gain at low current and low cost.

The oscillator of the invention and the super-reactive receiver of the invention incorporating it are particularly suitable for receiving electromagnetic waves in the radio-frequency band and in particular in the VHF and UHF frequency bands, between a few megahertz and several gigahertz.

The present invention will be better understood from the following description given by way of non-limiting example and with reference to the appended single figure of an oscillator incorporated in a super-reactive receiver for electromagnetic waves.

DETAILED DESCRIPTION OF THE PREFERRED EMBODIMENT

The super-reactive superheterodyne receiver 1 includes an oscillator 2.

The oscillator 2 includes an active component in the form of a bipolar transistor 3 and a reactive component in the form of a ceramic dielectric tubular coaxial resonator 4 connected directly to the collector of the transistor 3.

The base of the transistor 3 is connected to the negative pole 5 of a power supply or ground via a resistor 6. It is connected to a common point 7 via a resistor 8.

The core 9 of the resonator 4 is connected between the collector of the transistor 3 and the common point 7. Its screen 10 is connected to the common point 7.

The emitter of the transistor 3 is connected to the negative pole 5 via a resistor 11.

The common point is connected to the positive pole 12 of the power supply via a resistor 13 and to the negative pole via a capacitor 19.

To decouple the base of the transistor 3 a capacitor 14 is connected between the base of the transistor 3 and the common point 7.

An antenna 15 for receiving electromagnetic waves is connected to the emitter of the transistor 3 via a capacitor 16.

A feedback capacitor 17 connects the collector of the transistor 3 to its emitter. A capacitor 18 connects the emitter of the transistor 3 to the common point 7. The feedback capacitor 17 and the capacitor 18 together form a collector-emitter impedance adaptor. The capacitor 18 is optional.

The super-reaction receiver 1 is biased to a point near the current at which radio-frequency oscillation starts. A disabling/enabling signal is applied to it via the line 22, a resistor 20 and a capacitor 21, for example.

Low-frequency modulation of the radio-frequency carrier can be detected by extracting the variation in the mean current drawn by the oscillator stage, at the common point 7, for example, the sampling frequency being filtered by the capacitor 19.

Temperature stability can be improved by modifying the bias parameters such as the collector-base and collector-emitter voltages, or by inserting one or more components with temperature coefficients opposite the temperature drifts that occur without compensation, for example negative temperature coefficient capacitors.

In one practical implementation of the circuit described, oscillations started in the oscillator 2 at between 20 µA and 50 µA, at a frequency of 400 MHz with a stability of around 100 kHz for temperatures between −20° C. and +60° C. The total power consumption was about 40 µA at 400 MHz for a radio-frequency bandwidth from 300 kHz to 400 kHz.

The circuit is open to many modifications, in particular the use of a PNP transistor to connect the screen of the dielectric resonator directly to ground, or by total AC coupling of the dielectric resonator to the active component via a decoupling capacitor which has an impedance at the oscillation frequency which is low compared to the impedance of the dielectric resonator at the same frequency.

The receiver 5 just described combines simplicity, compact size and low cost with very low power consumption and can advantageously be used in home automation applications (remote control, security, comfort) or for remote controlled locking/unlocking of automobile, garage and other doors or gates.

There is claimed:

1. Super-reactive receiver comprising:
   a bipolar transistor having
      a base connected to a first pole of a power supply via a first resistor and connected to a common point via a second resistor and
      an emitter connected to said first pole via a third resistor;
   a ceramic tubular coaxial dielectric resonator having
      a core connected between a collector of said transistor and said common point and
      a screen connected to said common point; and
   a capacitor connected between said base of said transistor and said common point which is connected to a second pole of said power supply.

2. Super-reactive receiver according to claim 1 further including an antenna for receiving electromagnetic waves connected to said emitter of said transistor.

3. Super-reactive receiver according to claim 1 wherein a disabling/enabling signal is applied to said base of said transistor.

4. Super-reactive receiver according to claim 1 wherein said emitter of said transistor is connected to said collector of said transistor via a first emitter capacitor and to said common point via a second emitter capacitor.

5. Super-reactive receiver according to claim 1, wherein a capacitor is connected between said common point and a pole of said power supply.

* * * * *